United States Patent
Ho et al.

[11] Patent Number: 6,137,286
[45] Date of Patent: Oct. 24, 2000

[54] TEST HANDLER

[75] Inventors: Weng Wah Ho; Chill Kwai Ng, both of Singapore, Singapore

[73] Assignee: Advanced Systems Automation Limited, Singapore

[21] Appl. No.: 09/072,831

[22] Filed: May 5, 1998

[30] Foreign Application Priority Data

May 6, 1997 [SG] Singapore ............................ 9701390-8

[51] Int. Cl.⁷ .................................................. G01R 31/02
[52] U.S. Cl. ........................................ 324/158.1; 414/404
[58] Field of Search ............................... 324/158.1, 73.1, 324/765; 414/404, 406, 416, 754; 198/345.2, 803.5; 209/571, 572–574

[56] References Cited

U.S. PATENT DOCUMENTS

| | | | |
|---|---|---|---|
| 5,290,134 | 3/1994 | Baba ........................................ | 414/404 |
| 5,469,953 | 11/1995 | Igarashi et al. ........................ | 198/345.2 |
| 5,523,678 | 6/1996 | Mitsui .................................... | 324/158.1 |
| 5,894,218 | 4/1999 | Farnworth et al. ................... | 324/158.1 |

*Primary Examiner*—Vinh P. Nguyen
*Attorney, Agent, or Firm*—Lawrence Y. D. Ho; David D. Chung

[57] ABSTRACT

A test handler for picking up semiconductor devices from a conveying system and placing them at testing positions and returning the tested devices to the conveying system efficiently and modularly is shown. The basic apparatus has two concentric shafts each connected at one end to a cam following assembly and at the other end to a pick and place arm. The assembly has a block with a center bore for accommodating a ball screw and a longitudinal channel for receiving a lever cum cam follower subassembly connected to one end of the concentric shafts. The cam follower assembly and the concentric shafts translate the rotational movement of the ball screw into radial movement of the pick and place arms between the conveying system and the test rig. Another pick and insertion assembly associated detachably with the pick and place arms alternately picks up semiconductor devices from the conveying system and places them in position for testing. At the same time, tested devices are returned by the pick and insertion assembly to conveying system in the same cycle. Each of the pick and place arm features a quick change plate for accommodating a variety of semiconductor device sizes. As such, the present invention handles the testing of semiconductors efficiently and modularly.

8 Claims, 4 Drawing Sheets

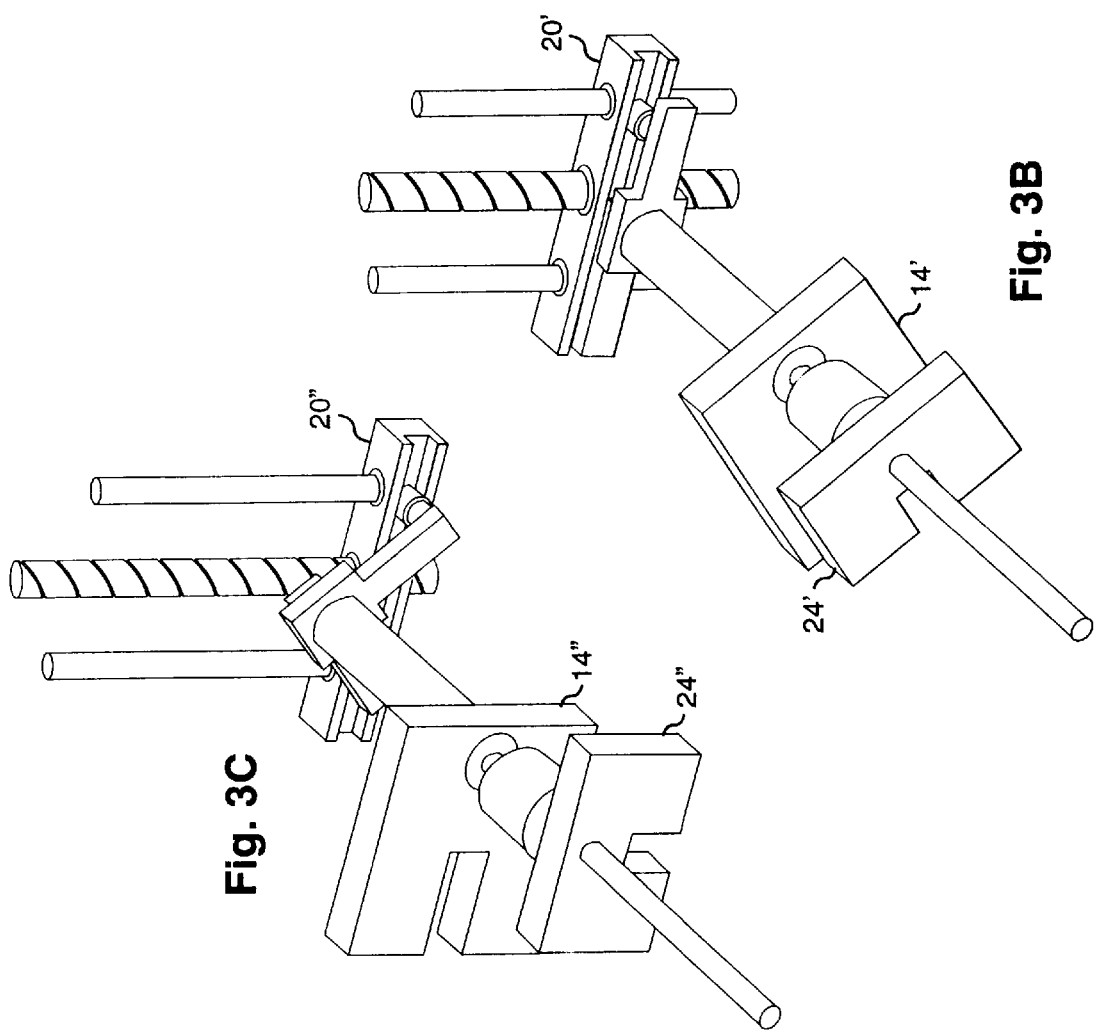

TEST HANDLER

FIELD OF THE INVENTION

The present invention relates to a quality control system for testing semiconductor devices. In particular, the present invention pertains to an apparatus for transferring semiconductor devices from a conveying system, placing them into a testing position for testing, and returning the tested devices to the conveying system efficiently and modularly.

BACKGROUND OF THE INVENTION

Quality control is an important stage in the mass production of semiconductor devices. By semiconductor devices, the present invention refers to not only semiconductor chips but also printed circuit boards. However, known methods of meeting quality control of the outputs from semiconductor device production lines require electrical signals to be send to leads of semiconductor devices and response measured therefrom before further packaging of such devices occurs. Such testing not only poses a bottleneck in the overall speed of production of semiconductor devices but also is a source for damaging such devices if the transfer of semiconductor devices to and forth the testing position is not handled properly.

Test handlers have been used in the electronics industry to transfer semiconductor devices into testing positions for testing the integrity of such devices. The testing positions usually have testing enclosures or chambers for receiving the semiconductor devices on known conveying systems. Test handlers within the testing enclosure pick up semiconductor devices, move them vertically upwards, turn them through an angle of 90 degrees in the same plane, move them forward to the test rig, and then reverse the movement to return the tested devices to the conveying system. Thereafter, the tested semiconductor devices are offloaded.

The speed and accuracy of test handler in picking up devices from the conveying system; placing them in testing positions within the testing enclosures; and returning them to the conveying systems are key factors in assessing the overall performance of a test handler. Lately, a third factor is receiving attention: the ability of a test handler to accept large variety of package sizes of semiconductor devices for testing with minimum down time in tool change.

OBJECT OF THE INVENTION

It is an object of the present invention to maximise the speed of test handling of semiconductor devices without affecting the physical integrity of such devices.

It is another object of the present invention to improve the overall speed of test handling of semiconductor devices by modularising key components of the test handler so that minimum down time occurs during tooling change.

It is yet another object of the present invention to minimise the tooling down time of a test handler by incorporating a quick change plate in the pick and place assembly.

SUMMARY OF THE INVENTION

The present invention is a test handler for picking up semiconductor devices from a conveying system and placing them at testing positions and returning the tested devices to the conveying system simultaneously. The basic apparatus has two concentric shafts each connected at one end to a cam following assembly and at the other end to a pick and place arm. The assembly has a block with a centre bore for accommodating transversely a ball screw and a longitudinal channel for receiving a lever cum cam follower subassembly connected to one end of the concentric shafts. The cam follower assembly and the concentric shafts translate the rotational movement of the ball screw into radial movement of the pick and place arms between the conveying system and the test rig. Another pick and insertion assembly associated detachably with the pick and place arms alternately picks up semiconductor devices and places them in position for testing. At the same time, tested devices are returned by the pick and insertion assembly to the conveying system in the same cycle. Each of the pick and place arm features a quick change plate for accommodating a variety of semiconductor device sizes. As such, the present invention handles the testing of semiconductors efficiently and modularly.

BRIEF DESCRIPTION OF THE DRAWINGS

FIGS. 3A–3C illustrate half a cycle of the test handler in operation according to the embodiment in FIG. 1 where the test handler in FIG. 3A is initially in 0 degree, FIG. 3B in 45 degree, and FIG. 3C in 90 degree positions respectively.

DESCRIPTION OF THE EMBODIMENT OF THE INVENTION

The present invention is an apparatus for test handling semiconductor devices in a testing position. In the following description, numerous specific details are set forth such as pick and place assembly, shafts and ball screw, etc. in order to provide a thorough understanding of the present invention. It will be obvious to one skilled in the art that the present invention may be practiced without these specific details. In other instances, well-known parts such as the chassis of a testing chamber and supporting fixtures are not shown in order not to obscure the present invention.

Figure 1:
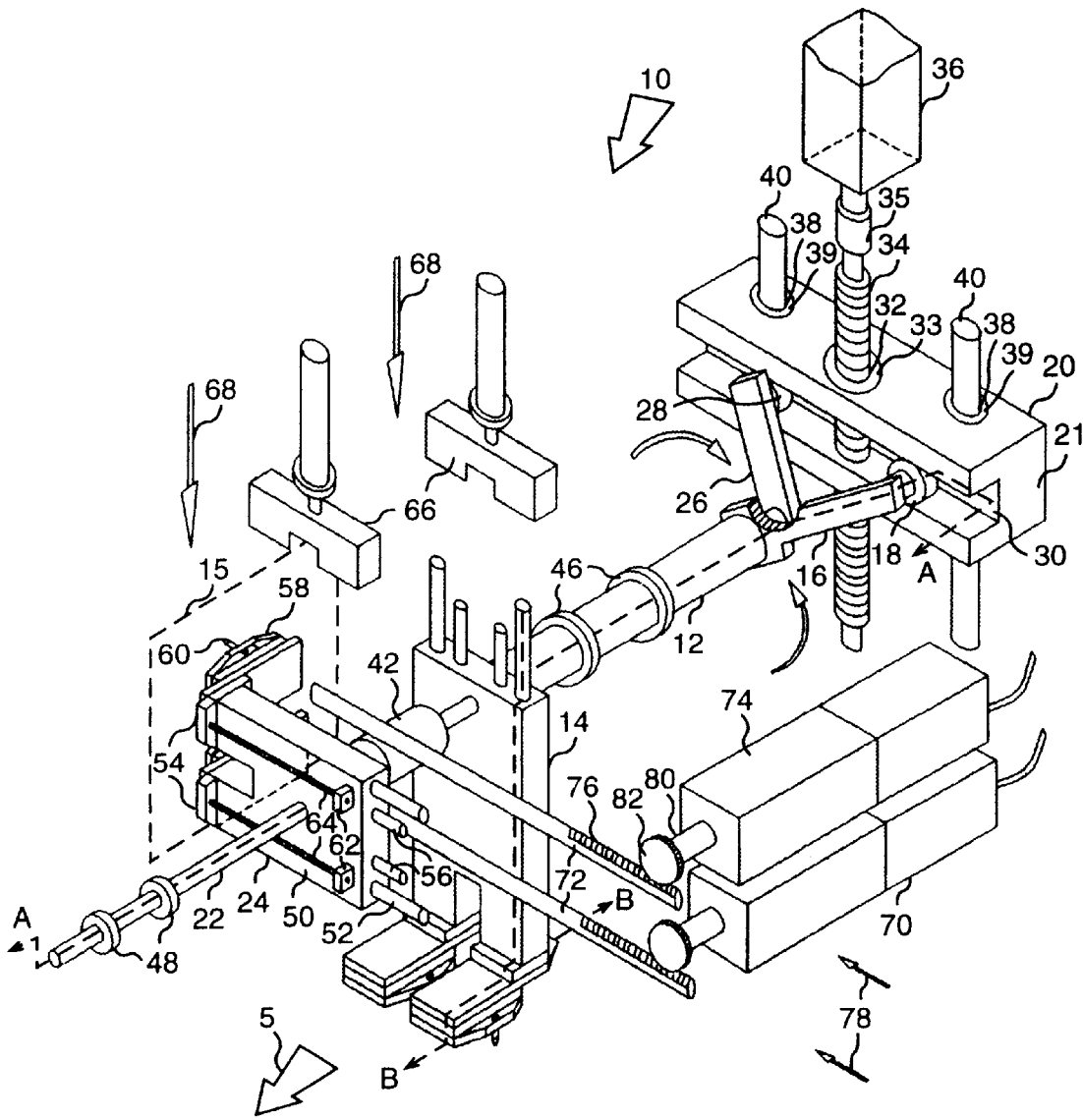
FIG. 1 is a elevational and perspective view of a basic embodiment of the test handler of the present invention.

FIG. 1 is an elevational and perspective view of a basic embodiment of a test handler 10 of the present invention. The test handler 10 comprises concentric shafts 12 and 22, pick and place assemblies 14 and 24 coupled to one end of shafts 12 and 22, levers 16 and 26 coupled to the other end of shafts 12 and 22, cam followers 18 and 28 fitted onto the free ends of levers 16 and 26 and preferably seated in a cam following assembly 20, and a ball screw 34 coupled to a prime mover 36 for driving the cam following assembly 20 a predetermined distance along the longitudinal direction of the ball screw 34. The test handler 10 of the present invention is preferably used in a testing enclosure or chamber (not shown in figures) of a test handler system where semiconductor devices are transported in tray carriers (not shown in figures) on a conveying subsystem (again not shown in figures) along a plane 5 which is parallel to and offset a predetermined distance from the longitudinal axis of concentric shafts 12 and 22. It should be understood by one skilled in the art that the present invention may be worked in an open environment and without testing enclosure for less stringent applications. Orthogonal to plane 5 and offset from the longitudinal axis of concentric shafts 12 and 22 is a testing position or plane 15 (not shown in figures) where the testing rig or equipment is located. The cam following assembly 20 translates rotational movement of the prime mover 36 and the ball screw 34 into a controlled radial movement of the pick and place assemblies 14 and 24 between plane 5 and plane 15. With a pick up mechanism 66 and an insertion assembly 70 which shall be elaborated further below, the test handler of the present invention picks up semiconductor devices from the plane 5 and places them onto the testing plane 15 while the tested devices are simultaneously picked up from the testing plane 15 and returned onto the tray carriers (not shown) quickly and accurately. As a result, the present invention accomplishes the process of test handling at substantially twice the speed of prior art test handlers. Illustration of the detailed motion of pick and place assemblies will be explained in connection with FIGS 3A–3C further below while the construction of the concentric shafts 12 and 22 will be elaborated below.

Figure 2:
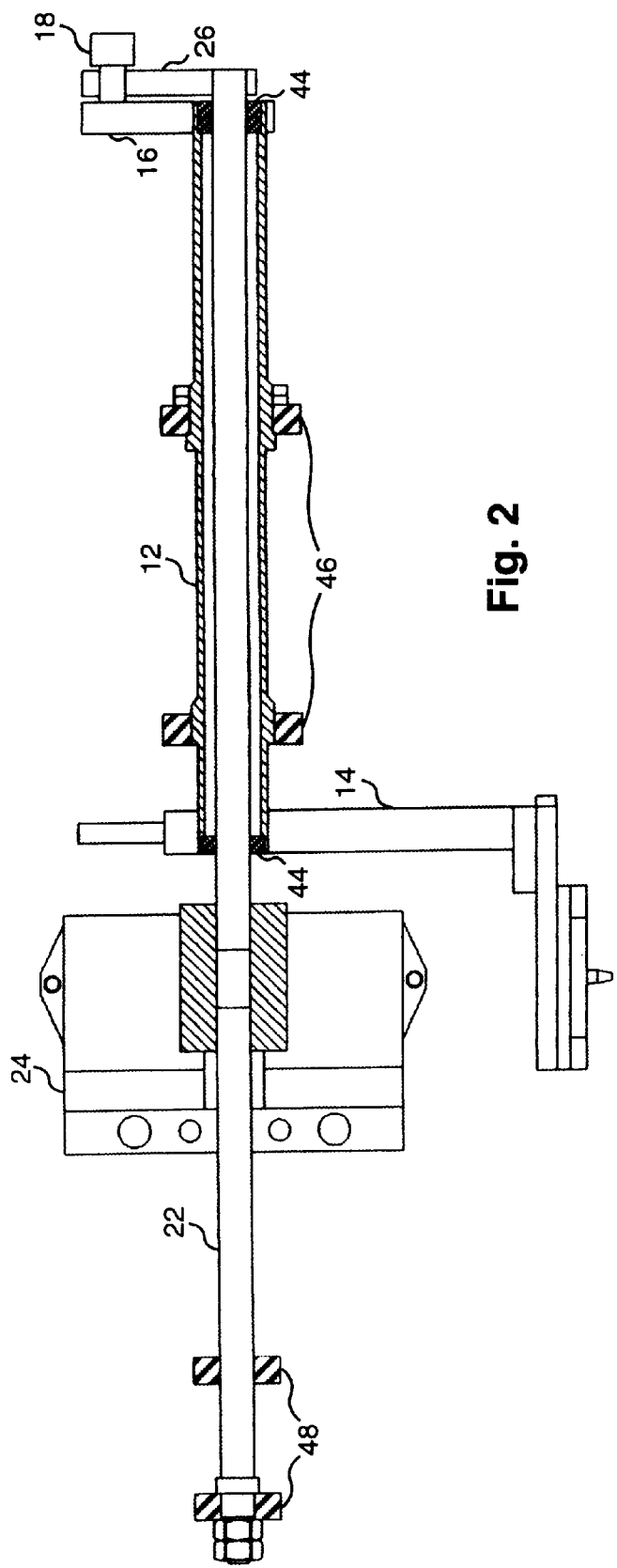
FIG. 2 is a cross section, side, elevational view of the concentric shaft and pick and place arm assembly of the test handler according to section A—A in FIG. 1.

FIG. 2 is a cross section, side, elevational view of the concentric shafts and pick and place arm assemblies of the test handler according to section A—A in FIG. 1. At least one shaft 12 is supported within a set of bearings 46 which is coupled to the structure of the test handler (not shown in FIG. 2). Although the structure connecting to the walls of the testing enclosure or chamber is not shown, it should be understood by one skilled in the art that bearings 46 support the shaft 12 so that it can rotate with minimal friction around its longitudinal axis. The pick and place assembly 14 is coupled to one end of the shaft 12 while the cam lever 16 is coupled to the other end. Disposed concentrically in the shaft 12 is at least another shaft 22 which is similarly supported within the interior of the shaft 12 with internal bearings 44 and external bearings 48. Like bearings 46, bearings 48 is supported with a known support coupled to the test handler. Referring again to FIG. 2, shaft 22 is optionally connected to a coupling 42. Just as the shaft 12, shaft 22 is coupled at one end to another pick and place assembly 24 and the other end to the cam lever 26 respectively. The levers 16 and 26 each terminates in a cam follower 18 and 28 respectively. The manner in which the cam followers cooperate with the cam following assembly will be elaborated further below. In the preferred embodiment of the present invention as shown in FIG. 1, the cam followers 18 and 28 coupled to the levers 16 and 26 comprise rollers. It should be understood by one skilled in the art that other friction reducing means may be employed. They are seated within a cam channel 30 of the cam following assembly 20 for moving slidably therealong within the channel when the cam following assembly 20 moves up and down along the longitudinal axis of the ball screw 34. In the preferred embodiment of the present invention, the cam following assembly 20 comprises a block 21 having at least one center bore 32 for receiving the ball screw 34 therethrough. The rotational movement of the ball screw is facilitated with at least one ball screw nut 33 disposed within the center bore 32 of the cam following assembly 20. In the preferred embodiment of the present invention, a ball screw nut is used to facilitate the conversion of the rotational movement of the ball screw into a linear movement of the cam following assembly. It should be understood by one skilled in the art that other devices such as ball screw collar can be used in place of the ball screw nut.

Referring again to FIG. 1, two side bores 38 are disposed adjacent to the centre bore 32 for aligning and stabilizing the movement of the cam following assembly 20. When the prime mover 36 receives signals from a controller (not shown in figures) to initiate motion, it drives the ball screw rotationally. The rotational movement of the ball screw 34 is translated by the ball screw nut 34 seated in the center bore of the cam following assembly to move cam levers 16 and 26 in unison. As the levers 16 and 26 and the cam followers 18 and 28 are aligned within the channel 30 in opposite direction, the translational movement of the cam followers generate radial movement of the concentric shafts 12 and 22 in opposing clock wise directions as indicated by the directional arrows in FIG. 1. The description of the sequential movement of the concentric shafts 12 and 22 as they go through their cycle will be elaborated further in connection with FIG. 3 below.

While the description thus far has focused on the cam following assembly 20 and the shafts 12 and 22, reference is now made to the details of the pick up and insertion mechanism of the test handler 10 of the present invention. Again in FIG. 1, the pick and place assembly 14 is seen coupled to the end farthest from the cam lever 16. Similarly, the pick and place assembly 24 is also coupled to the end farthest from the cam lever 26. In the preferred embodiment of the present invention, the pick and place assemblies 14 and 24 are identical except for the fact that one has a longer arm than the other. With reference to FIG. 1, the pick up arm of pick and place assembly 14 is longer than that of pick and place assembly 24 so that when the test handler is operational, the respective L bracket do not interfere with each other. It should be understood by one skilled in the art that pick and place assembly 14 does not always have to a longer arm; an equivalent configuration would be for pick and place assembly 24 to have a longer arm and assembly 14 a shorter arm.

As assemblies 14 and 24 are virtually identical to each other, the description for pick and place assembly 24 below applies for both. The pick and place assembly 24 comprises an lever 50, sliding shafts 52, L-bracket 54, floating plate 58 and spring mechanism 64. The arm lever 50 is coupled to the shaft 22 so that it extends orthogonally to the longitudinal axis of the shaft. Flushed with the leading edge of the arm lever 50 is the L-bracket 54 which is detachably coupled with the arm lever. In FIG. 1, at least two sliding shafts 52 extends orthogonally through side bores (not shown in figures) in the arm lever 50. Disposed between L-bracket 54 and spring bracket 62 on the arm lever 50 is a spring mechanism 64 for maintaining a compression force between the arm lever 50 and the L-bracket 54.

The sequence of picking up devices from tray carriers (not shown in figures), transferring the pick and place assemblies into position for testing, and inserting the components into testing rig for testing will be elaborated in connection with FIGS. 1 and 3. Referring to FIG. 1, the pick and place assembly 14 is shown to be in a position right above a tray carriers loaded with components (not shown in figures). Pick up mechanism 66 which is mounted on the structure of a test handler is lowered so that it engages the sliding shafts. The L-bracket is then lowered further by the pick up mechanism 66 along the pick up direction 68 so that it is aligned with the targeted components in the tray carrier (not shown). The control system of the tester (not shown in figures) then actuates a suction cup 87 coupled to a floating plate 58 (see, FIG. 4) to pick up the targeted components. The test handler 10 of the present invention then steps through the motion illustrated in FIGS. 3A–3C where the pick and place assemblies rotates and aligns with the testing rig (not shown in figures). Here, the insertion assembly 70, also mounted on the test handler, is then actuated to insert the picked up devices into the testing sockets on the testing plane 15. As shown and will be described in FIGS. 3A–3C, the pick and place assembly 24 is simultaneously returned to tray carrier with the tested components while the assembly 14 is rotated into the testing socket. The insertion assembly 70 comprises insertion shafts 72, and prime mover 74 for displacing the L-bracket along direction 78 in inserting picked up devices for testing in the testing rig (not shown). In the preferred embodiment of the present invention, the insertion shafts 72 have groove disposed on the exterior surface for engaging wheels 82 coupled to the prime mover 74. Note also that the direction 78 of insertion is orthogonal to the direction 68 of pick up. It should be understood by one skilled in the art that the pick up direction 68 does not necessarily have to be at right angle with the insertion direction 78.

FIGS. 3A–3C illustrate half a cycle of the test handler in operation according to the embodiment in FIG. 1 where the test handler in FIG. 3A is initially in 0 degree, FIG. 3B in 45 degree, and FIG. 3C in 90 degree positions respectively. In FIG. 3A, the pick and place assembly 14 is initialised at 0 degree and the assembly 24 at 90 degree. By 0 degree, the present invention refers to position the pick and place assembly is aligned over the tray carrier and ready to pick up components therefrom. By 90 degree, the present invention refers to the other extreme position of the cycle; here, the pick and place assembly 24 is aligned with the testing socket and ready to lift tested components therefrom. At the other end of the shafts 12 and 22, the cam following assembly 20 is initialized with levers 16 and 26 fully extended at an acute angle with each other.

FIG. 3B shows the intermediate position of the test handler. Here, assemblies 14 and 24 are aligned with each other at approximately 45 degree. Similarly, the cam levers 16 and 26 at the other end of the shafts 12 and 22 are aligned opposite with each other. In FIG. 3C, the assembly 14 reaches insertion position while the assembly 24 returns to the tray carrier. As FIGS. 3A–3C comprises half a cycle, the respective assemblies steps through a reverse movement of sequence before the tested devices are finally tested and returned to the tray carrier.

The combination of concentric shafts and the cam following assembly of the present invention achieves at least a one fold increase in speed of transferring the pick and place assemblies between the conveying plane 5 and the testing plane 15. The pick up mechanism 66 and insertion assembly 70 which are mounted on the test handler engage the pick and place assemblies 14 and 24 when the latter are aligned over either the conveying system or the testing rig. The detachable configuration of the pick mechanism and insertion assembly from the pick and place assemblies not only reduces the inertia of the pick and place assemblies 14 and 24 during the transfer operation, but also obviates any instability of the insertion operation of the test handler. As such, the test handler of the present invention accomplishes its functions accurately and durably.

While the modularity and communality incorporated in the shaft and cam following assemblies offer improvement in meeting customers' demand for choice of package sizes and configuration, the present invention also focuses on the tool change requirement as another variable in minimizing down time during the quality control process.

Figure 4B:
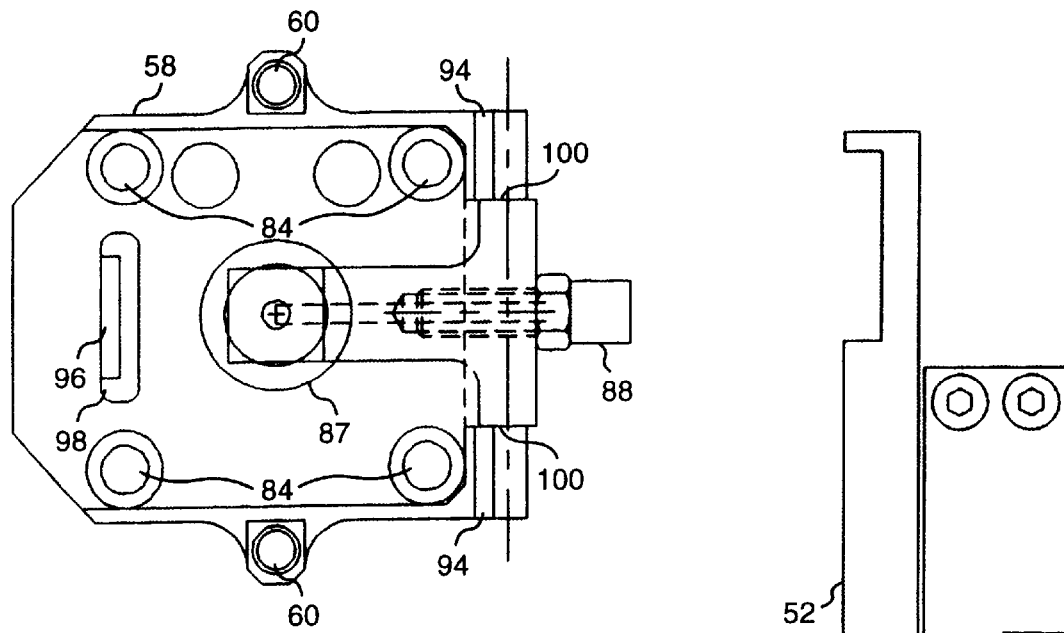
FIG. 4B is a top, elevational view of the quick change plate being fitted to the floating plate of the pick and place arm in FIG. 4A.
Figure 4A:
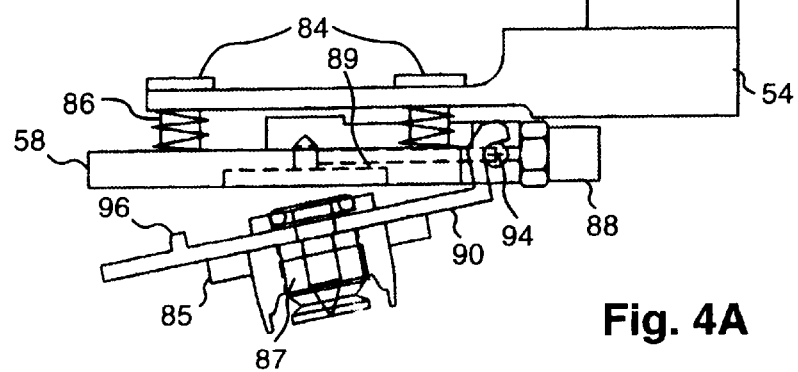
FIG. 4A is a cross section, elevational view of the pick and place arm and the quick change plate as shown in section B—B in FIG. 1.

FIGS. 4A and 4B illustrates a quick change plate for complimenting the modular shaft and cam following assembly in FIGS. 1–3. Prior art L-bracket for test handler features a floating plate with the suction-cup and nest coupled to the underside thereof. To change for tray carriers loaded with different package size and configuration means that a technician has to remove the floating plate from the pick and place assembly. Such procedure is time consuming and detracts from the overall productivity of the quality control process. The present invention features a quick-change plate 90 which modularise the tool changing process.

The quick-change plate 90 of the present invention in FIGS. 4A and 4B is detachably coupled to the floating plate 58. The floating plate is a plate coupled to the L-bracket 54 with screws 84. In most pick and place assemblies, at least four such screws 84 are used. Thus changing the prior art floating plate requires a technician or test handler operator to remove at least four screws from the L-bracket 54 during tool change. In contrast, the present invention comprises a quick-change plate 90 having dog leg latches 92 which are detachably coupled to roll pins 94 projected laterally from guided surfaces 100 disposed on the floating plate 58. Instead of having the nest 85 and suction cup 87 disposed on the underside of the floating plate 58, they are disposed on the underside of the quick-change plate 90 as shown in FIG. 4A. FIG. 4B is a bottom, elevational view of the quick-change plate being fitted to the floating plate of the pick and place arm in FIG. 4A. The floating plate 58 features at least a pair of locating pins 60 and a lateral inlet 88 for connecting to a source for pneumatic pressure. The dotted line in FIG. 4B shows the outline of an internal bore which leads to a centre cavity. Here, the quick-change plate 90 is shown fitted right over the floating plate 58 where the suction cup 87 is detachably coupled to the centre cavity of the floating plate for picking up a semiconductor device (not shown in figures). On the underside and at the end closer to the inlet 88 are raised guiding surfaces 100 for guiding and aligning the quick-change plate 90 of the present invention.

The quick-change plate 90 of the present invention allows the test handler operator to change the nest for accommodating a variety of package sizes without unfastening the screws and connectors to the pneumatic pressure. As such, the down time for tool change is minimised.

While the present invention has been described particularly with reference to FIGS. 1 to 4 with emphasis on an apparatus for transferring semiconductor devices between a conveying system and a testing location, it should be understood that the figures are for illustration only and should not be taken a limitation on the invention. In addition, it is clear that the method and apparatus of the present invention has utility in many applications where transfer of semiconductor devices is required. It is contemplated that many changes and modifications may be made by one of ordinary skill in the art without departing from the spirit and the scope of the invention as described. For instance, the cam following block can have more than one cam channel, i.e., having cam channels on both sides of the cam following block.

What is claimed is:

1. A transfer apparatus for facilitating within a test handler the transfer of semiconductor devices to and forth at least one testing position, said transfer apparatus transporting along a first predetermined plane a plurality of semiconductor devices disposed within at least one tray carrier, said testing position being aligned and flushed with a second predetermined plane for receiving semiconductor devices for testing therein, said apparatus comprising:

at least two concentric shafts each connected at one end to a cam following assembly and at the other end to a pick and place assembly for positioning said pick and place assembly above said first predetermined plane and said second predetermined plane respectively, said shafts being supported within said test hander;

said cam following assembly further comprising at least one cam following block having a centre bore for receiving a ball screw therethrough and at least one longitudinal cam channel for receiving two cam followers therein, said centre bore converting the rotational movement of said ball screw into translational movement of said block, said cam followers each being coupled to one end of a cam lever, said cam levers being further coupled to one end of said concentric shafts for converting translational movement of the said cam following block into radial movement of said pick and place assemblies;

said pick and place assembly further comprising at least one arm lever, a detachable bracket, a sliding shaft, spring mechanism and a floating plate for picking up and releasing semiconductor devices, said arm lever having side bores for receiving sliding shafts coupled orthogonally to said detachable bracket, said spring mechanism connecting said arm lever and said detachable bracket for maintaining a compression tension therebetween, said floating plate further having at least one nest and one suction cup for maintaining a pressure differential between the suction cup and semiconductor devices; and pick and insertion assembly mounted on said test handler for engaging pick and place assembly when it is above testing location, said pick and insertion assembly further extending said detachable bracket of said pick and place assembly for either the pick up or insertion operation of said test handler, said pick and insertion assembly further allowing said detachable bracket to retract after the pick up or insertion operation of said test handler is completed;

whereby said pick and place assemblies of said test handler picks up and inserts semiconductor devices to said testing location simultaneously and accurately.

2. The transfer apparatus as in claim 1 wherein said concentric shafts are supported within said test handler with circular bearings.

3. The transfer apparatus as in claim 1 wherein said concentric shafts has one shaft with a smaller diameter than the other.

4. The concentric shafts as in claim 3 wherein said smaller diameter shaft is supported within the interior walls of said larger shaft with bearings.

5. The transfer apparatus as in claim 1 wherein said ball screw comprises a worm screw.

6. The transfer apparatus as in claim 1 wherein said pick and place assemblies rotates radially in the same plane.

7. The transfer apparatus as in claim 1 wherein said first predetermined plane and said second predetermined plane disposed orthogonally with each other.

8. The transfer apparatus as in claim 1 wherein cam following assembly incorporates at least two opposing longitudinal cam channels.

* * * * *